(12) United States Patent
Aritome

(10) Patent No.: US 7,551,466 B2
(45) Date of Patent: Jun. 23, 2009

(54) BIT LINE COUPLING

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 454 days.

(21) Appl. No.: 11/360,873

(22) Filed: Feb. 23, 2006

(65) Prior Publication Data

US 2007/0195571 A1 Aug. 23, 2007

(51) Int. Cl.
*G11C 5/06* (2006.01)

(52) U.S. Cl. ........................................... 365/63

(58) Field of Classification Search ............. 365/63, 365/185.05, 185.06, 185.11, 185.21, 214; 257/315
See application file for complete search history.

(56) References Cited

U.S. PATENT DOCUMENTS

| 5,317,535 | A | 5/1994 | Talreja et al. |
| 5,337,281 | A | 8/1994 | Kobayashi et al. |
| 5,570,315 | A * | 10/1996 | Tanaka et al. .......... 365/185.22 |
| 5,822,248 | A * | 10/1998 | Satori et al. ............ 365/185.21 |
| 6,084,820 | A | 7/2000 | Raszka |
| 6,377,504 | B1 | 4/2002 | Hilbert |
| 6,859,397 | B2 * | 2/2005 | Lutze et al. ............ 365/185.28 |
| 6,947,324 | B1 | 9/2005 | Lee et al. |
| 2004/0051133 | A1 * | 3/2004 | Sugita et al. ................. 257/315 |
| 2004/0208037 | A1 | 10/2004 | Winograd et al. |

OTHER PUBLICATIONS

U.S. Appl. No. 11/405,762, filed Apr. 18, 2006, Goda, Akira et al.

* cited by examiner

*Primary Examiner*—Richard Elms
*Assistant Examiner*—Harry W Byrne
(74) *Attorney, Agent, or Firm*—Leffert Jay & Polglaze, P.A.

(57) ABSTRACT

The invention provides methods and apparatus. Alternate bit-line pairs of a memory device are concurrently selected. Each bit-line pair has one bit line formed at a first vertical level and one adjacent bit line formed at a second vertical level different than the first vertical level.

35 Claims, 7 Drawing Sheets

BIT LINE COUPLING

TECHNICAL FIELD OF THE INVENTION

The present invention relates generally to memory devices and in particular the present invention relates to bit line coupling.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating gate memory cells by selecting the word-select line coupled to their gates. The row of selected memory cells then place their data values on the column bit lines by flowing a differing current, depending upon their programmed states, from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

During conventional program and read operations, alternate bit lines are selected to reduce bit-line-to-bit-line cross coupling effects. However, cross coupling effects may still occur for memory devices having bit lines located on different vertical levels because of a lack of shielding used in these configurations.

For the reasons stated above, and for other reasons stated below which will become apparent to those skilled in the art upon reading and understanding the present specification, there is a need in the art for alternative bit line selection and coupling schemes.

SUMMARY

The above-mentioned problems with conventional program and read operations and other problems are addressed by the present invention and will be understood by reading and studying the following specification.

For one embodiment, the invention provides a method of operating a memory device, including concurrently selecting alternate bit-line pairs, where each bit-line pair has one bit line formed at a first vertical level and one adjacent bit line formed at a second vertical level different than the first vertical level.

For another embodiment, the invention provides a memory device having an array of memory cells coupled to a plurality of bit lines. A first bit line is selectively coupled to a first sensing device through a first select gate. The first bit line is formed at a first level. A second bit line is adjacent the first bit line and is selectively coupled to the first sensing device through a second select gate. The second bit line is formed at a second level. A third bit line is adjacent the second bit line and is selectively coupled to a second sensing device through a third select gate. The third bit line is formed at the first level. A fourth bit line is adjacent the third bit line and is selectively coupled to the second sensing device through a fourth select gate. The fourth bit line is formed at the second level. A control gate of the first select gate is coupled to a control gate of the fourth select gate, and a control gate of the second select gate is coupled to a control gate of the third select gate.

For another embodiment, the invention provides a memory device having an array of memory cells coupled to a plurality of bit lines. A first bit line is selectively coupled to a first sensing device through a first select gate. The first bit line is formed at a first level. A second bit line is adjacent the first bit line and is selectively coupled to a second sensing device through a second select gate. The second bit line is formed at a second level. A third bit line is adjacent the second bit line and is selectively coupled to the first sensing device through a third select gate. The third bit line is formed at the first level. A fourth bit line is adjacent the third bit line and is selectively coupled to the second sensing device through a fourth select gate. The fourth bit line is formed at the second level. A control gate of the first select gate is coupled to a control gate of the second select gate, and a control gate of the third select gate is coupled to a control gate of the first select gate.

Further embodiments of the invention include methods and apparatus of varying scope.

DETAILED DESCRIPTION

Figure 1:
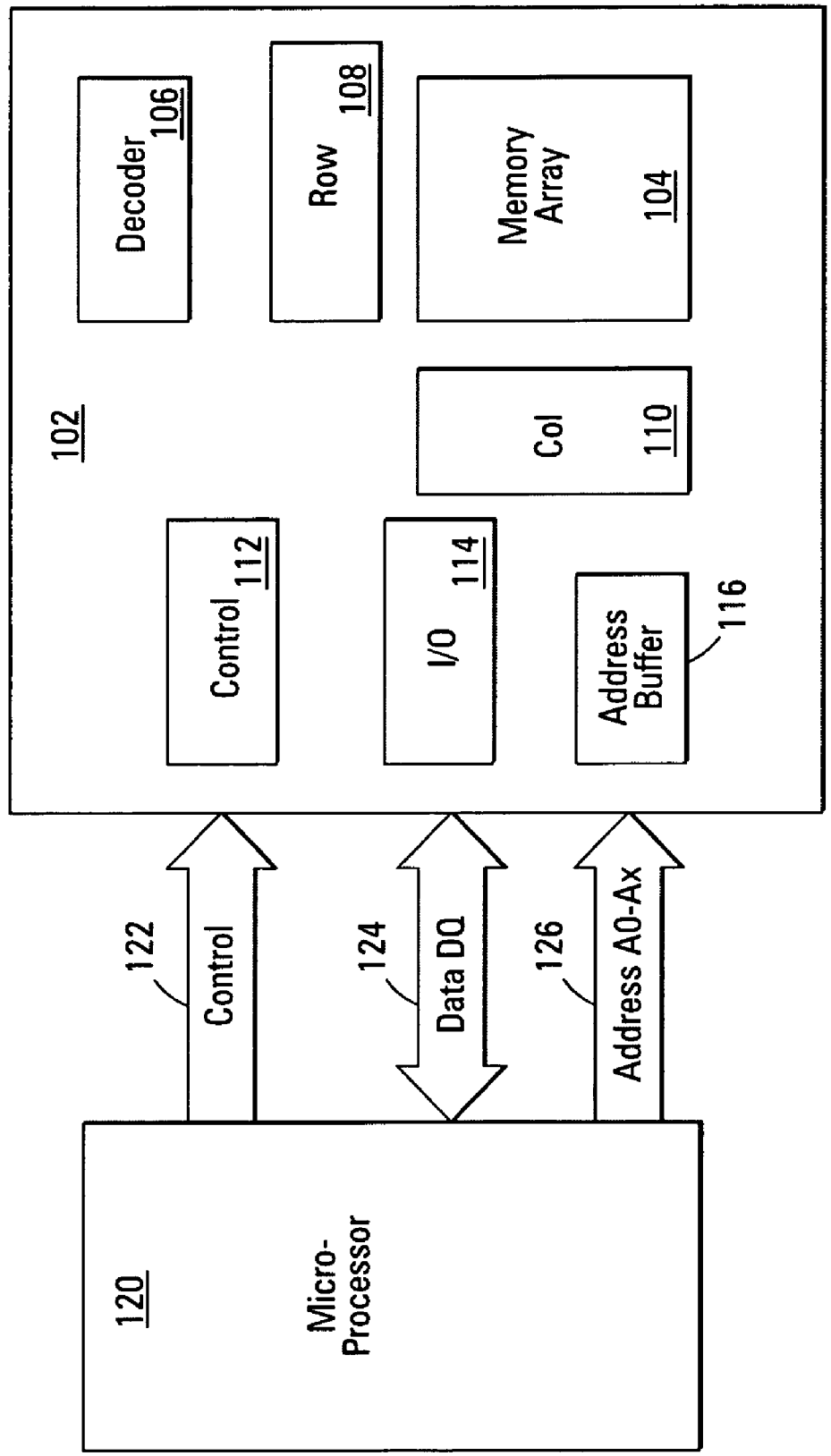
FIG. 1 is a block diagram illustration of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Use the following if applicable: The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND, NOR, or NROM flash memory devices, dynamic random access memory devices (DRAMs), static random access memory devices (SRAMs), or the like.

For one embodiment, memory device 102 includes an array of flash memory cells 104, an address decoder 106, row access circuitry 108, column access circuitry 110, control circuitry 112, Input/Output (I/O) circuitry 114, and an address buffer 116. Column access circuitry 110 includes multiplexing circuitry in accordance with embodiments of the invention. Control circuitry 112 is adapted to perform operations of the invention.

Memory device 102 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation. Column bit lines of memory array 104 are formed at different vertical levels.

Figure 2:
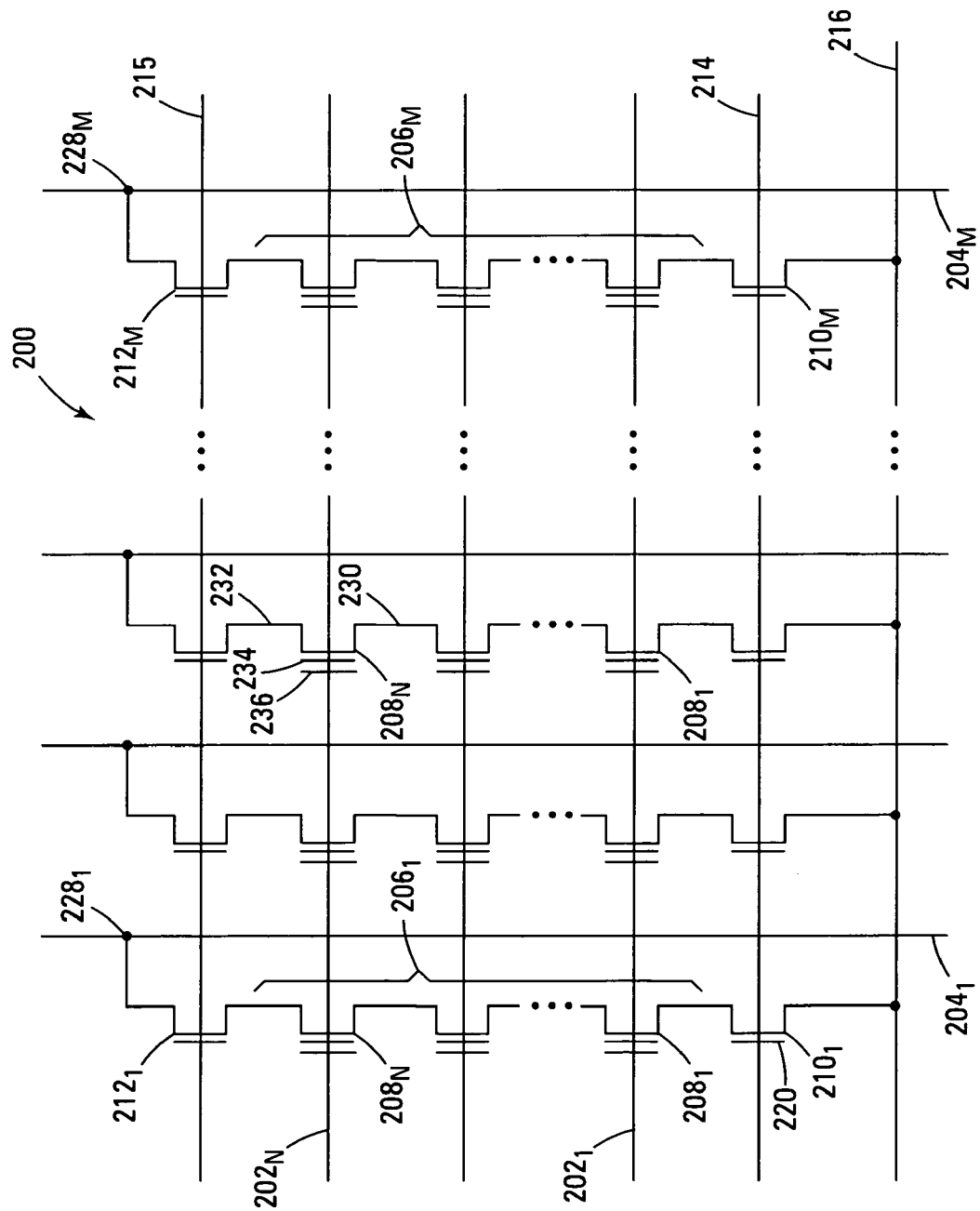
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting bit lines $204_1$ to $204_M$. For one embodiment, bit lines 202 are formed at different vertical levels. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3:
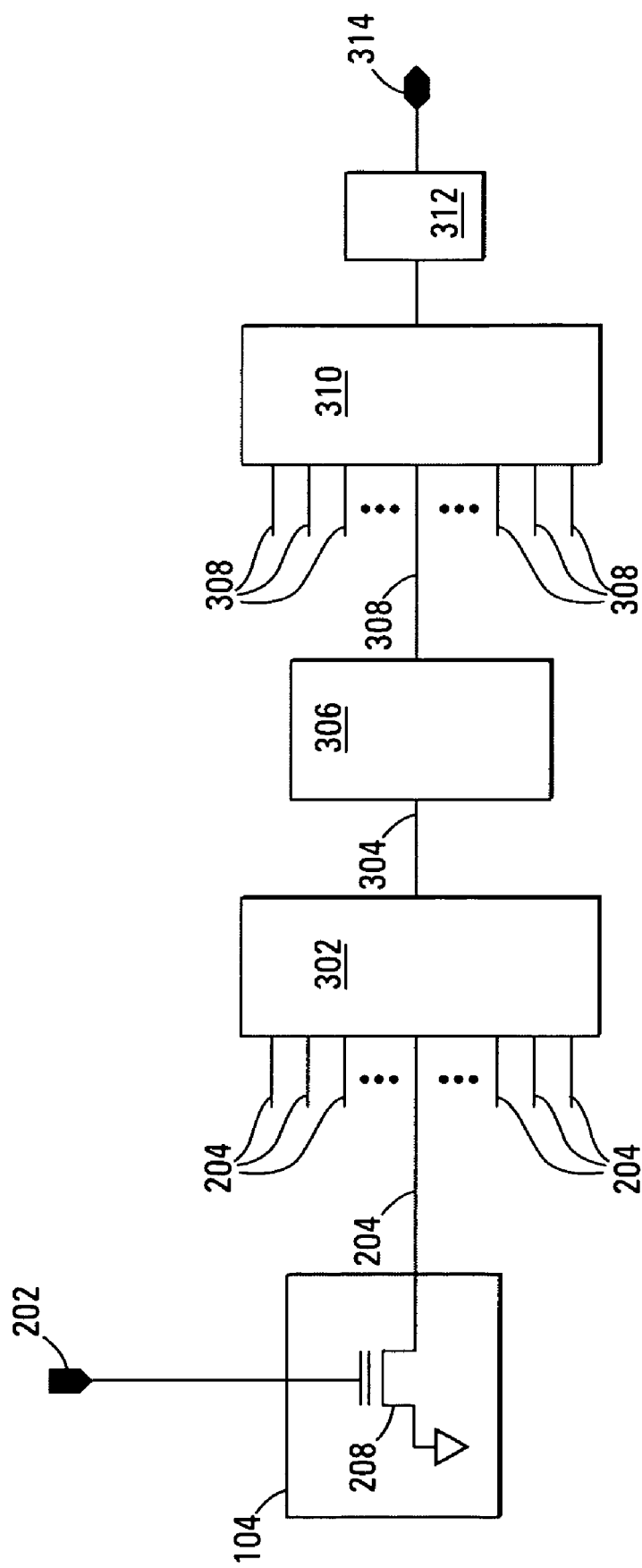
FIG. 3 is a schematic of a data path proceeding from a memory array through column access circuitry to I/O circuitry in accordance with an embodiment the invention.

FIG. 3 is a schematic of a data path proceeding from the memory array through the column access circuitry to the I/O circuitry in accordance with an embodiment the invention. Because memory devices typically contain millions, if not billions, of memory cells, it is common to have multiple levels of multiplexing in coupling a memory cell to a DQ line of the memory device.

As shown in FIG. 3, a target memory cell 208, as part of memory array 200, is selectively coupled to a first multiplexer 302 through its associated bit line 204, along with bit lines 204 from a number of other memory cells (not shown in FIG. 3). As one example, for a memory array 200 of the type depicted in FIG. 2, a target memory cell 208 might be selectively coupled to the first multiplexer 302 upon activation of its word line 202 and an associated drain select gate (not shown in FIG. 3). The first multiplexer 302 may be configured to select one of every two or more bit lines in response to an address decoder (not shown in FIG. 3) and couple it to an output 304. The first multiplexer 302 is configured in accordance with embodiments of the invention. It will be apparent that other memory array configurations, such as NOR configurations, are also suitable for use with the invention.

The output 304 is provided to sensing and latching circuitry 306. The sensing and latching circuitry 306 senses the data value of the target memory cell 208 and provides a signal indicative of its data value on its output 308. The output 308 of sensing and latching circuitry 306 is then provided to column decode circuitry 310 along with other outputs 308 from other sensing devices (not shown in FIG. 3). The column decode circuitry 310 is configured to select one of a plurality of outputs 308 in response to an address decoder (not shown in FIG. 3) and couple it to an output latch 312 to place the data signal on the node 314, such as a DQ line, of the memory device. Note that the data path is generally bi-directional, and the output latch 312 generally also receives data values from the node 314 during a write operation to the memory device. Often, the data path includes two data signal legs, i.e., for carrying complementary logic levels.

Figure 4:
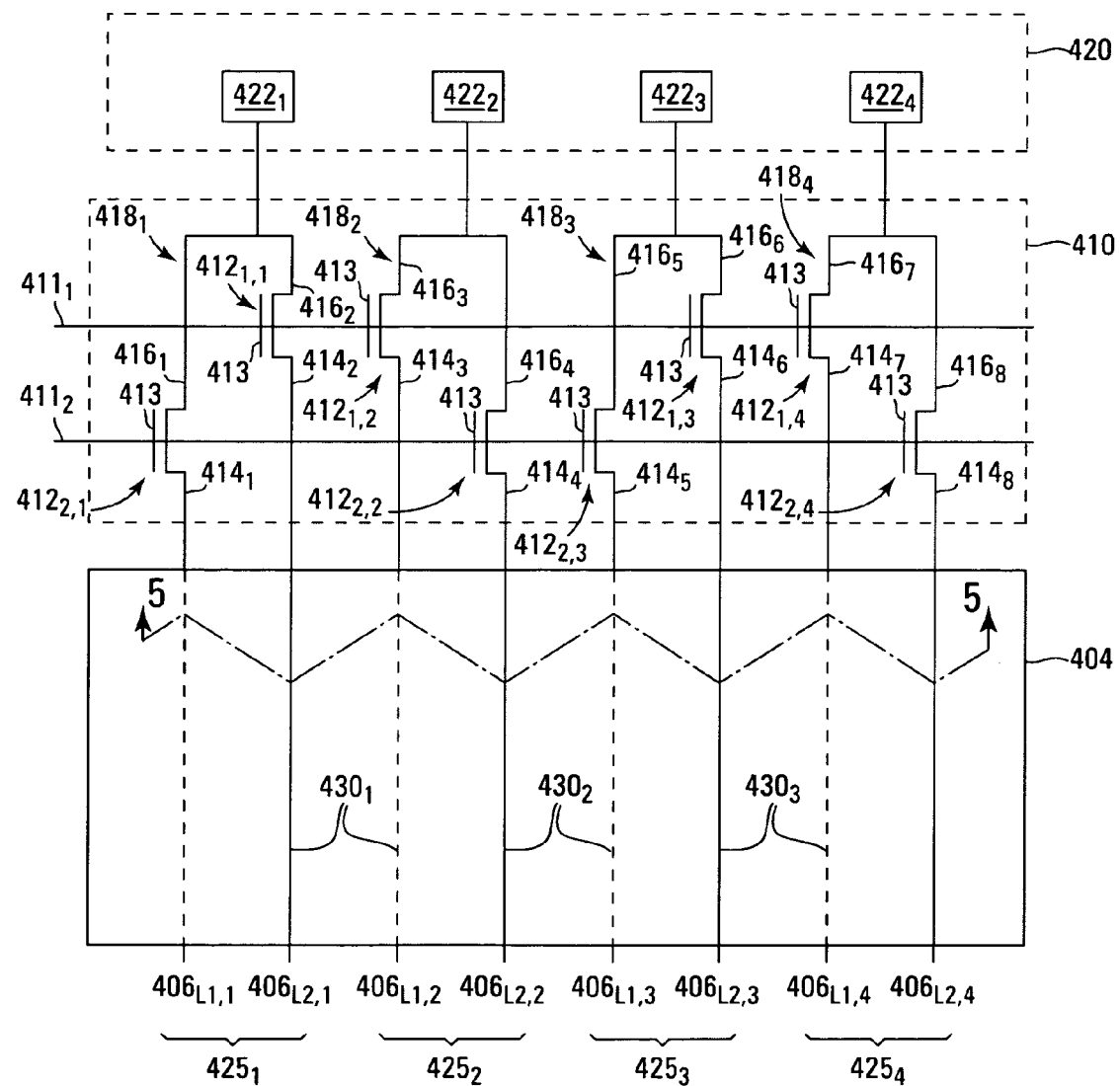
FIG. 4 illustrates a portion of a memory device, according to another embodiment of the invention.

FIG. 4 illustrates a portion of a memory device, such as memory device 102 of FIG. 1, according to another embodiment of the invention. For one embodiment, a memory array 404 of FIG. 4 may include bit lines $406_{L1}$ formed at a first vertical level L1 of memory array 404, as denoted by the subscript L1, and bit lines $406_{L2}$ formed at a second vertical level L2, different from the first vertical level L1, of memory array 404, as denoted by the subscript L2. For example, the second vertical level L2 may overlie the first vertical level L1, as illustrated in FIG. 5.

Figure 5:
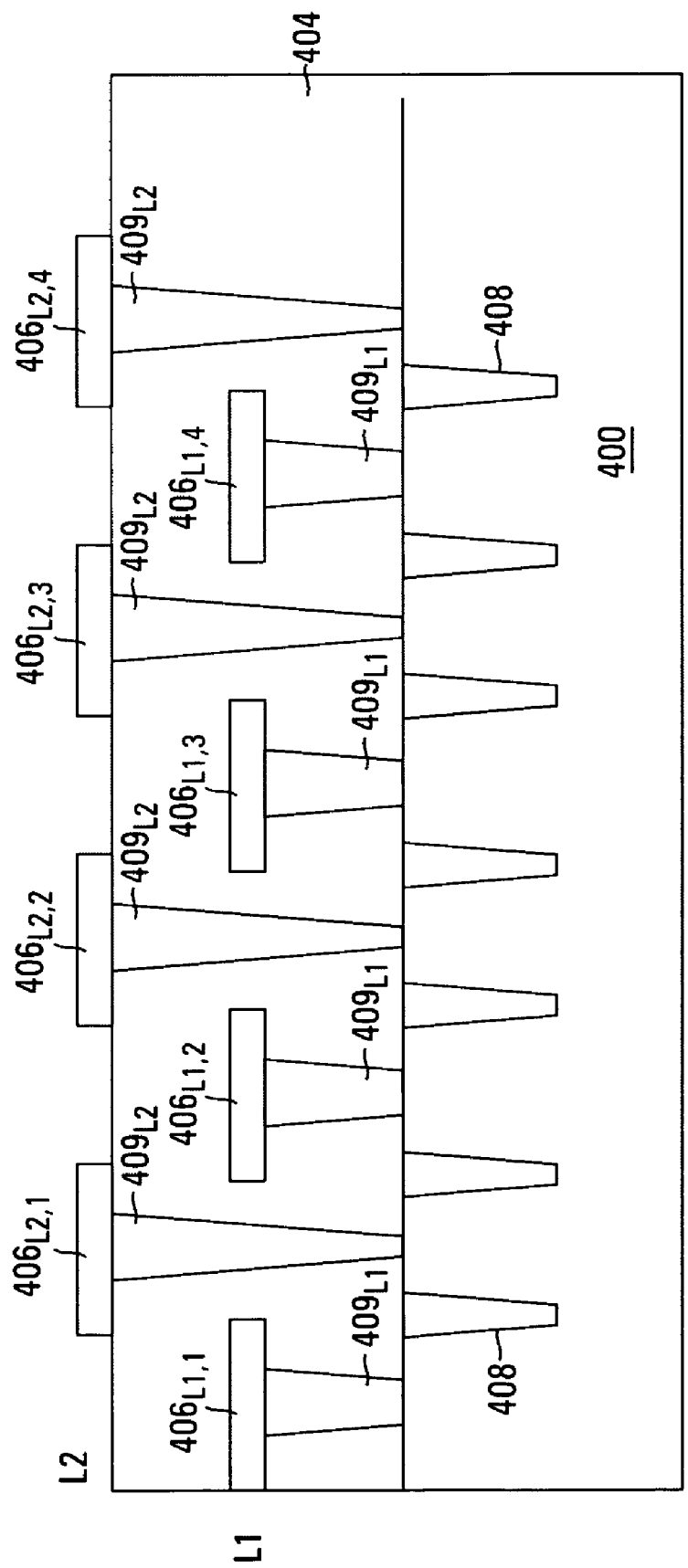
FIG. 5 is a cross-sectional view of a portion of a memory array taken along line 5-5 of FIG. 4.

FIG. 5 is a cross-sectional view of a portion of memory array 404 taken along line 5-5 of FIG. 4. Columns of memory cells (not shown in FIG. 5), separated by isolation regions 408 formed in a semiconductor substrate 400, run perpendicular to FIG. 5, with source and drain regions (not shown in FIG. 5) formed at opposing ends, one above the face plane of FIG. 5 and one below the face plane of FIG. 5. Contacts (or via plugs) 409 couple bit lines 406 to drain regions of drain select gates, such as drain select gates 212 of FIG. 2. It is noted that FIG. 5 can depict either a NOR-type memory device or a NAND-type memory device, with the differences occurring in the column direction in manners that are well understood in the art of memory fabrication.

Bit lines 406 are coupled to a multiplexer 410 that is selectively coupled to a sensing device 420, as shown in FIG. 4. Multiplexer 410 includes rows of select gates 412, such as field effect transistors (FETs), having their control gates 413 commonly coupled to control lines 411. Bit lines 406 are respectively coupled to source/drain regions 414 of select gates 412. Source/drain regions 416 of a pair of successive select gates 412, respectively coupled to different control lines 411 and located in different rows, are coupled together (or are shared) to form select-gate pairs 418. For example, source/drain regions $416_1$ and $416_2$ respectively of the pair of successive select gates $412_{2,1}$ and $412_{1,1}$, respectively coupled to control lines $411_2$ and $411_1$, are coupled together to form select-gate pair $418_1$, source/drain regions $416_3$ and $416_4$ respectively of the pair of successive select gates $412_{1,2}$ and $412_{2,2}$ respectively coupled to control lines $411_1$ and $411_2$ are coupled together to form select-gate pair $418_2$, etc. Select-gate pairs 418 are coupled to sensing circuits 422 of sensing device 420 in a one-to-one relationship, as shown in FIG. 4.

For one embodiment, a bit line 406 formed at the first vertical level L1 and a bit line 406 formed at the second vertical level L2 are respectively coupled to source drain/regions 414 of each pair of successive select gates 412 of a select-gate pair 418. For example, bit lines $406_{L1,1}$ and $406_{L2,1}$ are respectively coupled to source drain/regions $414_1$ and $414_2$ of the pair of successive select gates $412_{2,1}$ and $412_{1,1}$ of select-gate pair $418_1$, bit lines $406_{L1,2}$ and $406_{L2,2}$ are respectively coupled to source drain/regions $414_3$ and $414_4$ of the pair of successive select gates $412_{1,2}$ and $412_{2,2}$ of select-gate pair $418_2$, etc. Note that source/drain regions $416_1$ and $416_2$ respectively of select gates $412_{2,1}$ and $412_{1,1}$ of select-gate pair $418_1$ are coupled to sensing circuit $422_1$, source/drain regions $416_3$ and $416_4$ respectively of select gates $412_{1,2}$ and $412_{2,2}$ of select-gate pair $418_2$ to sensing circuit $422_2$, etc.

Note further that successively adjacent bit lines 406 of successively adjacent bit-line pairs 425 are respectively located at the first vertical level L1 and the second vertical level L2. For example, successively adjacent bit lines $406L_{1,1}$ and $406L_{2,1}$ of bit-line pair $425_1$ are respectively located at the first vertical level L1 and the second vertical level L2, successively adjacent bit lines $406L_{1,2}$ and $406L_{2,2}$ of bit-line pair $425_2$ are respectively located at the first vertical level L1 and the second vertical level L2, etc. Moreover, bit lines 406 of successively adjacent bit-line pairs 425 respectively successively alternate between the first and second vertical levels, where the alternating bit lines 406 are respectively selectively coupled to sensing circuits 422 through the select gates 412 commonly coupled to one of the control lines 411. For example, bit lines $406_{L1,1}$, $406_{L2,2}$, $406_{L1,3}$, and $406_{L2,4}$, respectively of bit-line pairs $425_1$, $425_2$, $425_3$, and $425_4$, are respectively selectively coupled to sensing circuits $422_1$, $422_2$, $422_3$, and $422_4$ respectively through the select gates $412_{2,1}$, $412_{2,2}$, $412_{2,3}$, and $412_{2,4}$ commonly coupled to control line $411_2$. Bit lines $406_{L2,1}$, $406_{L1,2}$, $406_{L2,3}$, and $406_{L1,4}$, respectively of bit-line pairs $425_1$, $425_2$, $425_3$, and $425_4$, are respectively coupled to the select gates $412_{1,1}$, $412_{1,2}$, $412_{1,3}$, and $412_{1,4}$ commonly coupled to control line $411_1$.

During operation, a row of select gates 412 is activated in response to a control signal received on the control line 411 for that row. Note that control signals are received from column access circuitry of the memory device, such as column access circuitry 110 of memory device 102 of FIG. 1. Control signals generated by the column access circuitry are in response to control signals from memory control circuitry of the memory device, such as memory control circuitry 112 of memory device 102 of FIG. 1.

Activation of a row of select gates 412 concurrently selects the bit lines 406 coupled to the activated row of select gates. That is, one bit line 406 is selected from each of the successively adjacent bit-line pairs 425, where the selected bit lines 406 of successively adjacent bit-line pairs 425 are respectively at different vertical levels. In other words, the selected bit lines 406 of successively adjacent bit-line pairs 425 respectively successively alternate between the first and second vertical levels. For example, activation of the row of select gates 412 commonly coupled to control line $411_2$ selects bit line $406_{L1,1}$ of bit-line pair $425_1$, bit line $406_{L2,2}$ of bit-line pair $425_2$, bit line $406_{L1,3}$ of bit-line pair $425_3$, and bit line $406_{L2,4}$ of bit-line pair $425_4$ Note that if control line $411_1$ is at a logic level to activate the control gates coupled thereto, control line $411_2$ is at a logic level to deactivate the control gates coupled thereto.

Activation of the row of select gates couples one bit line 406 from each of the successively adjacent bit-line pairs 425, where the selected bit lines 406 of successively adjacent bit-line pairs 425 are respectively at different vertical levels, to a respective one of sensing circuits 422. That is, the selected bit lines 406 of successively adjacent bit-line pairs 425 respectively successively alternate between the first and second vertical levels and are respectively coupled to sensing circuits 422 through select gates 412. For example, the selected bit lines $406_{L1,1}$, $406_{L2,2}$, $406_{L1,3}$, and $406_{L2,4}$, respectively of bit-line pairs $425_1$, $425_2$, $425_3$, and $425_4$, are respectively coupled to sensing circuits $422_1$, $422_2$, $422_3$, and $422_4$, respectively through select gates $412_{2,1}$, $412_{2,2}$, $412_{2,3}$, and $412_{2,4}$.

Note that bit-line pairs 430 may also be defined, as shown in FIG. 4, where bit-line pairs 430 are interposed between a bit line 406 at the first vertical level, e.g., $406_{L1,1}$, and a bit line 406 at the second vertical level, e.g., $406_{L2,4}$. Each bit-line pair 430 includes successively adjacent bit lines 406, where the adjacent bit lines 406 of each bit-line pair 430 are respectively located at the first vertical level L1 and the second vertical level L2. Moreover, the respective adjacent bit lines 406 of alternate bit-line pairs (or two bit line pairs 430 with an interposing bit-line pair 430 therebetween) are selectively coupled to different sensing circuits 422. For example, bit-line pair $430_1$ includes adjacent bit lines $406_{L2,1}$ and $406_{L1,2}$, respectively selectively coupled to sensing circuits $422_1$ and $422_2$ respectively through select gates $412_{1,1}$ and $412_{1,2}$, bit-line pair $430_3$ includes adjacent bit lines $406_{L2,3}$ and $406_{L1,4}$, respectively selectively coupled to sensing circuits $422_3$ and $422_4$ respectively through select gates $412_{1,3}$ and $412_{1,4}$. Also, bit-line pair $430_2$ includes adjacent bit lines $406_{L2,2}$ and $406_{L1,3}$, selectively respectively coupled to sensing circuits $422_2$ and $422_3$ respectively through select gates $412_{2,2}$ and $412_{2,3}$. Note that the bit lines 406 of alternate bit-line pairs 430 are coupled to select gates 412 that are coupled to a common select line 411.

Activation of a row of select gates 412 concurrently selects alternate bit-line pairs 430 that are coupled to the activated row of select gates. Activation of the row of select gates couples the respective adjacent bit lines 406 of each selected bit-line pair 430 to different sensing circuits 422. For example, adjacent bit lines $406_{L2,1}$ and $406_{L1,2}$ of bit-line pair $430_1$ are respectively coupled to sensing circuits $422_1$ and $422_2$ respectively through select gates $412_{1,1}$ and $412_{1,2}$, and adjacent bit lines $406_{L2,3}$ and $406_{L1,4}$ of bit-line pair $430_3$ are respectively coupled to sensing circuits $422_3$ and $422_4$ respectively through select gates $412_{1,3}$ and $412_{1,4}$ in response to control line $411_1$ receiving a control signal.

Figure 6:
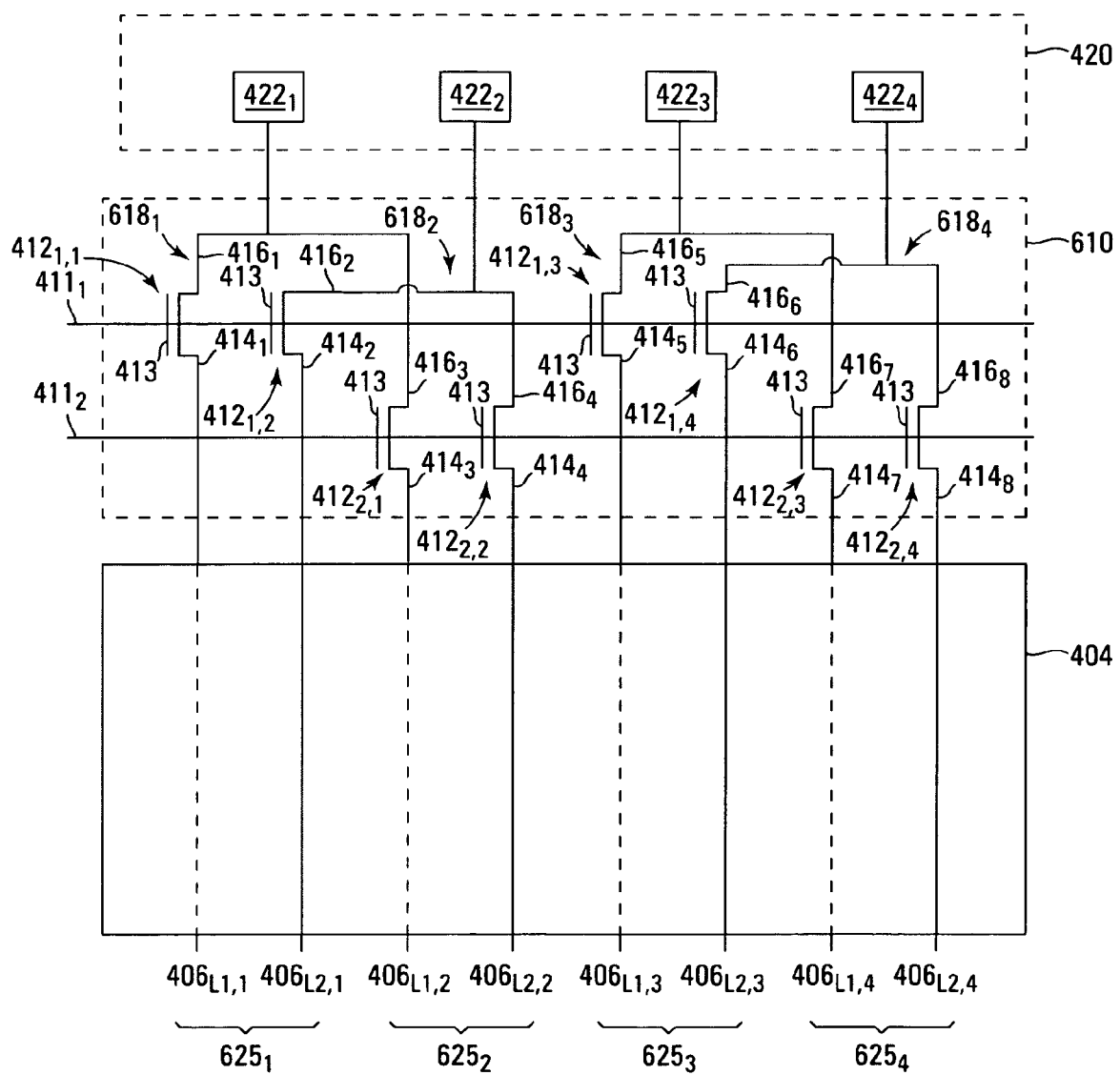
FIG. 6 illustrates a portion of a memory device, according to another embodiment of the invention.

FIG. 6 illustrates a portion of a memory device, such as memory device 102 of FIG. 1, according to another embodiment of the invention. Common reference numbers denote common or similar elements of FIGS. 4 and 6. Source/drain regions 416 of a pair of alternate select gates 412, respectively coupled to different control lines 411 and located in different rows, are coupled together (or are shared) to form select-gate pairs 618 of multiplexer 610. For example, source/drain regions $416_1$ and $416_3$ respectively of the pair of alternate select gates $412_{1,1}$ and $412_{2,1}$, respectively coupled to control lines $411_1$ and $411_2$, are coupled together to form select-gate pair $618_1$, source/drain regions $416_2$ and $416_4$ respectively of the pair of alternate select gates $412_{1,2}$ and $412_{2,2}$, respectively coupled to control lines $411_1$ and $411_2$, are coupled together to form select-gate pair $618_2$, etc. Select-gate pairs 618 are coupled to one-to-one with sensing circuits 422 of sensing device 420, as shown in FIG. 6.

For one embodiment, source drain/regions 414 of select gates 412 of alternate select-gate pairs 618 are respectively coupled to bit lines 406 formed at one of the vertical levels, while source drain/regions 414 of select gates 412 of the remaining select-gate pairs 618 are respectively coupled to bit lines 406 formed at another of the vertical levels. For example, source/drain regions $414_1$ and $414_3$ and source/drain regions $414_5$ and $414_7$, respectively of select-gate pair $618_1$ and select-gate pair $618_3$, are respectively coupled to bit lines $406_{L1,1}$ and $406_{L1,2}$ of first vertical level L1 and bit lines $406_{L1,3}$ and $406_{L1,4}$ of first vertical level L1. Source/drain regions $414_2$ and $414_4$ and source/drain regions $414_6$ and $414_8$, respectively of select-gate pair $618_2$ and select-gate pair $618_4$, are respectively coupled to bit lines $406_{L2,1}$ and $406_{L2,2}$ of second vertical level L2 and bit lines $406_{L2,3}$ and $406_{L2,4}$ of second vertical level L2.

Note that alternate bit-line pairs 625 are coupled to select gates 412 of a single row, i.e., to select gates commonly coupled to a select line 411. For example, alternate bit-line pairs $625_1$ and $625_3$ are respectively coupled to select gates $412_{1,1}$ and $412_{1,2}$ and select gates $412_{1,3}$ and $412_{1,4}$ that are commonly coupled to control line $411_1$. Remaining bit-line pairs 625 are coupled to select gates 412 of another single row, i.e., to select gates commonly coupled to a different select line 411. For example, bit-line pairs $625_2$ and $625_4$, are respectively coupled to select gates $412_{2,1}$ and $412_{2,2}$ and select gates $412_{2,3}$ and $412_{2,4}$ that are commonly coupled to control line $411_2$.

Note that each bit-line pair 625 includes successively adjacent bit lines 406, where the adjacent bit lines 406 of each bit-line pair 625 are respectively located at the first vertical level L1 and the second vertical level L2 and where the respective adjacent bit lines 406 of each bit-line pair 625 are selectively coupled to different sensing circuits 422. For example, bit-line pair $625_1$ includes adjacent bit lines $406_{L1,1}$ and $406_{L2,1}$, respectively selectively coupled to sensing circuits $422_1$ and $422_2$ respectively through select gates $412_{1,1}$ and $412_{1,2}$, and bit-line pair $625_3$ includes adjacent bit lines $406_{L1,3}$ and $406_{L2,3}$, respectively selectively coupled to sensing circuits $422_3$ and $422_4$ respectively through select gates $412_{1,3}$ and $412_{1,4}$. Also, bit-line pair $625_2$ includes adjacent bit lines $406_{L1,2}$ and $406_{L2,2}$, selectively respectively coupled to sensing circuits $422_1$ and $422_2$ respectively through select gates $412_{2,1}$ and $412_{2,2}$, and bit-line pair $625_4$ includes adjacent bit lines $406_{L1,4}$ and $406_{L2,4}$, respectively selectively coupled to sensing circuits $422_3$ and $422_4$ respectively through select gates $412_{2,3}$ and $412_{2,4}$.

Activation of a row of select gates 412 concurrently selects alternate bit-line pairs 625 that are coupled to the activated row of select gates. Activation of the row of select gates couples the respective adjacent bit lines 406 of each selected bit-line pair 625 to different sensing circuits 422. For example, in response to control line $411_1$ receiving a control signal, adjacent bit lines $406_{L1,1}$ and $406_{L2,1}$ of bit-line pair $625_1$ are respectively coupled to sensing circuits $422_1$ and $422_2$ respectively through select gates $412_{1,1}$ and $412_{1,2}$, and adjacent bit lines $406_{L1,3}$ and $406_{L2,3}$ of bit-line pair $625_3$ are respectively coupled to sensing circuits $422_3$ and $422_4$ respectively through select gates $412_{1,3}$ and $412_{1,4}$. The remaining bit-line pairs 625, e.g., bit-line pairs $625_2$ and $625_4$ are not selected.

Bit-line pairs $625_2$ and $625_4$ are selected concurrently when the row select gates 414 selectively coupled thereto are activated in response to control line $411_2$ receiving a control signal. For example, bit lines $406_{L1,2}$ and $406_{L2,2}$ of bit-line pair $625_2$ are respectively selected upon activation of select gates $412_{2,1}$ and $412_{2,2}$ that respectively couple bit lines $406_{L1,2}$ and $406_{L2,2}$ of bit-line pair $625_2$ to sensing circuits $422_1$ and $422_2$. Bit lines $406_{L1,4}$ and $406_{L2,4}$ of bit-line pair $625_4$ are respectively selected upon activation of select gates $412_{2,3}$ and $412_{2,4}$ that respectively couple bit lines $406_{L1,4}$ and $406_{L2,4}$ of bit-line pair $625_4$ to sensing circuits $422_3$ and $422_4$.

Figure 7:
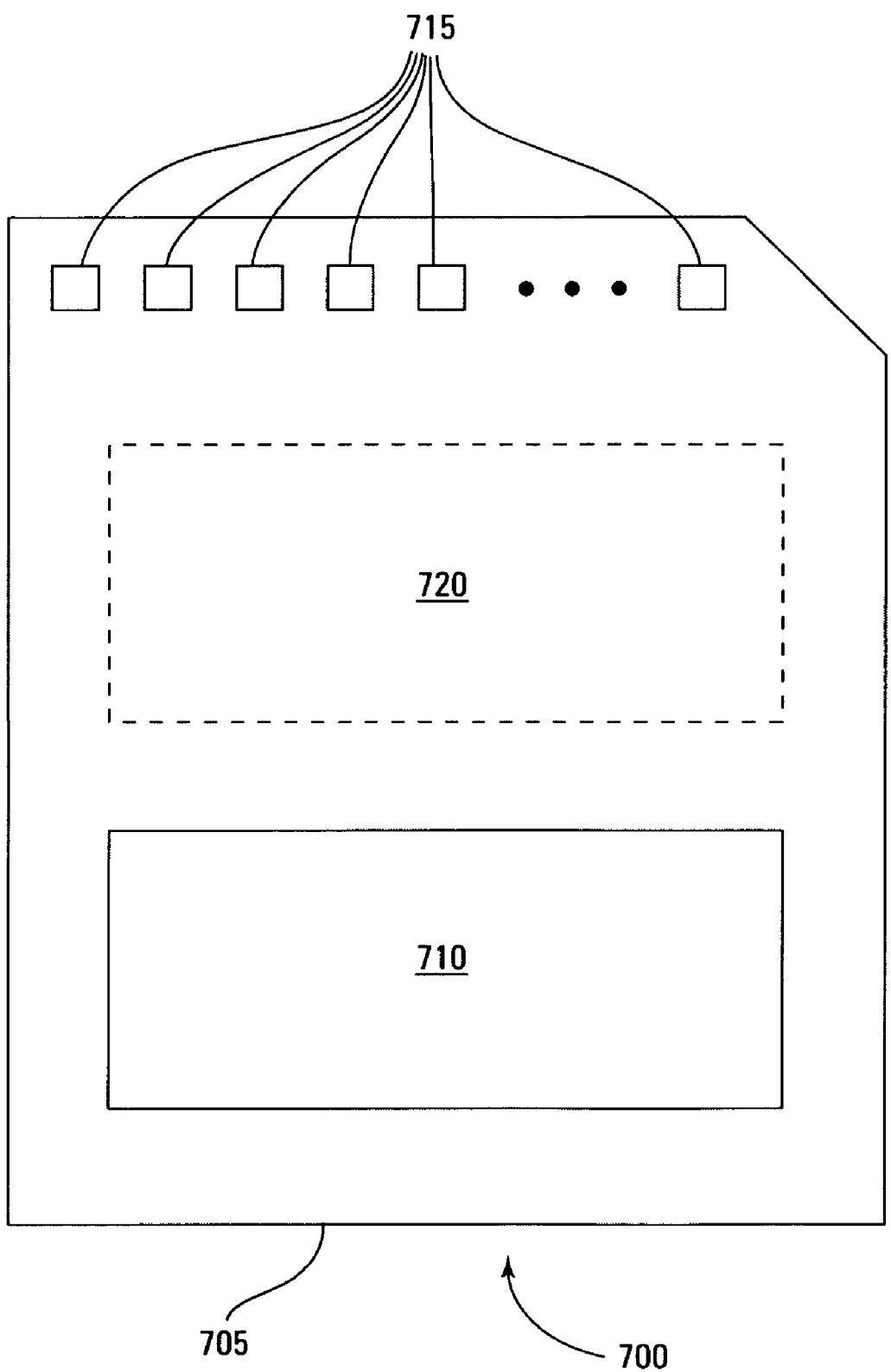
FIG. 7 is an illustration of an exemplary memory module, according to another embodiment of the invention.

FIG. 7 is an illustration of an exemplary memory module 700, according to another embodiment of the invention. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 may be a NAND, NOR, or NROM flash memory device, dynamic random access memory device (DRAMs), static random access memory device (SRAMs), or the like, and may be similar to memory device 102 of FIG. 1. A memory array of the at least one memory device 710 includes bit lines formed at different vertical levels and multiplexing circuitry in accordance with embodiments of the invention. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address, and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 300 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory device, comprising:
    concurrently selecting alternate bit-line pairs;
    wherein each bit-line pair comprises one bit line formed at a first vertical level and one adjacent bit line formed at a second vertical level different than the first vertical level; and
    wherein an interposing bit-line pair between the selected bit-line pairs is not selected.

2. The method of claim 1, wherein concurrently selecting alternate bit-line pairs comprises activating a row of select gates coupled to each bit line of the alternate bit-line pairs.

3. The method of claim 2, wherein activating a row of select gates coupled to each bit line of the alternate bit-line pairs is in response to receiving a signal at a control line coupled to the row of select gates.

4. A method of operating a memory device, comprising:
    concurrently coupling alternate bit-line pairs to a sensing device;
    wherein each coupled bit-line pair comprises a first bit-line formed at a first vertical level and a second bit line formed at a second vertical level different than the first vertical level; and wherein the first and second bit lines are respectively coupled to sensing circuits of the sensing device through concurrently activated select gates coupled to a common control line.

5. The method of claim 4, wherein concurrently coupling alternate bit-line pairs to a sensing device is in response to the common control line receiving a signal.

6. A method of operating a memory device, comprising:
respectively concurrently coupling first and second successively adjacent bit lines of alternate bit-line pairs to sensing circuits;
wherein the first and second bit lines are coupled to the sensing circuits through select gates;
wherein each of the select gates is coupled to a common control line;
wherein coupling the first and second bit lines of the alternate bit-line pairs to the sensing circuits is in response to receiving a signal at the common control line that activates the select gates; and
wherein the first bit lines are formed at a first vertical level and the second bit lines formed at a second vertical level different than the first vertical level.

7. The method of claim 6, wherein
the select gates are first select gates and have first and second source/drain regions, the first bit lines coupled to the first source/drain regions of a first portion of the first select gates and the second bit lines coupled to the first source/drain regions of a second portion of the first select gates;
first source/drain regions of non-activated second select gates are respectively coupled to the second source/drain regions of the first select gates, wherein third bit lines formed at the second vertical level are respectively coupled to second source/drain regions of the non-activated second select gates whose first source/drain regions are respectively coupled to the second source/drain regions of the first portion of first select gates and fourth bit lines formed at the first vertical level are respectively coupled to second source/drain regions of the non-activated second select gates whose first source/drain regions are respectively coupled to the second source/drain regions of the second portion of first select gates; and
the first source/drain regions of the non-activated second select gates and the second source/drain regions of the first select gates are coupled to the sensing circuits.

8. The method of claim 7, wherein the common control line is a first control line and the non-activated second select gates are commonly coupled to a second control line.

9. The method of claim 6, wherein
the select gates are first select gates and have first and second source/drain regions, the first bit lines coupled to the first source/drain regions of a first portion of the first select gates and the second bit lines coupled to the first source/drain regions of a second portion of the first select gates;
first source/drain regions of non-activated second select gates are respectively coupled to the second source/drain regions of the first select gates, wherein third bit lines formed at the first vertical level are respectively coupled to second source/drain regions of the non-activated second select gates whose first source/drain regions are respectively coupled to the second source/drain regions of the first portion of first select gates and fourth bit lines formed at the second vertical level are respectively coupled to second source/drain regions of the non-activated second select gates whose first source/drain regions are respectively coupled to the second source/drain regions of the second portion of first select gates; and
the first source/drain regions of the non-activated second select gates and the second source/drain regions of the first select gates are coupled to the sensing circuits.

10. The method of claim 9, wherein the common control line is a first control line and the non-activated second select gates are commonly coupled to a second control line.

11. A method of operating a memory device, comprising:
concurrently selecting a bit line from each of successively adjacent pairs of bit lines by activating a row of select gates coupled to each selected bit line;
wherein the selected bit lines respectively alternate between different vertical levels; and
wherein an unselected bit line of each pair of bit lines is coupled to a non-activated row of select gates.

12. The method of claim 11, wherein the selected bit lines respectively successively alternate between first and second vertical levels.

13. The method of claim 11, wherein activating the row of select gates coupled to each selected bit line is in response to receiving a signal at a control line commonly coupled to the row of select gates.

14. A method of operating a memory device, comprising:
concurrently coupling a bit line from each of successively adjacent pairs of bit lines to a sensing device;
wherein the selected bit lines respectively alternate between first and second bit lines of the pairs, the first and second bit lines respectively formed at first and second vertical levels, the second vertical level different than the first vertical level; and
wherein the first and second bit lines are respectively coupled to sensing circuits of the sensing device through select gates coupled to a common control line.

15. The method of claim 14, wherein concurrently coupling a bit line from each of successively adjacent pairs of bit lines to a sensing device comprises concurrently activating the select gates.

16. The method of claim 14, wherein concurrently coupling a bit line from each of successively adjacent pairs of bit lines to a sensing device is in response to the common control line receiving a signal.

17. A method of operating a memory device, comprising:
coupling a first bit line of a first pair of bit lines to a first sensing circuit through a first select gate; and
coupling a second bit line of a second pair of bit lines to a second sensing circuit through a second select gate;
wherein the first pair of bit lines is adjacent the second pair of bit lines;
wherein the first bit line is formed at a vertical level different than the second bit line; and
wherein the first and second select gates are coupled to a common control line.

18. The method of claim 17, wherein a remaining bit line of the first pair of bit lines is formed at a vertical level the same as the second bit line.

19. The method of claim 17, wherein a remaining bit line of the second pair of bit lines is formed at a vertical level the same as the first bit line.

20. A method of operating a memory device, comprising:
selecting first and second bit lines of a first pair of bit lines to couple the first and second bit lines of the first pair of bit lines respectively to first and second sensing circuits; and selecting first and second bit lines of a second pair of bit lines to couple the first and second bit lines of the second pair of bit lines respectively to third and fourth sensing circuits;

wherein a third pair of bit lines is interposed between the first and second pairs of bit lines and first and second bit lines of the third pair of bit lines are unselected; and wherein the first bit line of each pair is formed at a vertical level different than the second bit line.

21. A memory device, comprising:

an array of memory cells coupled to a plurality of bit lines;

a first bit line selectively coupled to a first sensing device through a first select gate, the first bit line formed at a first level;

a second bit line adjacent the first bit line and selectively coupled to the first sensing device through a second select gate, the second bit line formed at a second level;

a third bit line adjacent the second bit line and selectively coupled to a second sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the fourth select gate; and wherein a control gate of the second select gate is coupled to a control gate of the third select gate.

22. A memory device, comprising:

an array of memory cells coupled to a plurality of bit lines;

a first bit line selectively coupled to a first sensing device through a first select gate, the first bit line formed at a first level;

a second bit line adjacent the first bit line and selectively coupled to a second sensing device through a second select gate, the second bit line formed at a second level;

a third bit line adjacent the second bit line and selectively coupled to the first sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the second select gate; and wherein a control gate of the third select gate is coupled to a control gate of the fourth select gate.

23. A memory device, comprising:

a row of select gates commonly coupled to a control line; and alternate bit-line pairs coupled to the select gates, each of the alternate bit-line pairs comprising a first bit line formed at a first vertical level and a second bit line formed at a second vertical level different than the first vertical level.

24. The memory device of claim 23, wherein the select gates respectively selectively couple the first and second bit lines of the alternate bit-line pairs to sensing circuits.

25. The memory device of claim 24, wherein the select gates are first select gates, the control line is a first control line, and further comprising:

an interposed bit-line pair between the alternate bit-line pairs having a first bit line at the first vertical level and a second bit line at the second vertical level; and a row of second select gates commonly coupled to a second control line;

wherein the first bit line of the interposed bit-line pair is selectively coupled to the same sensing circuit as the first bit line of a first one of the alternating pairs through a second select gate and the second bit line of the interposed bit-line pair is selectively coupled to the same sensing circuit as the second bit line of the first one of the alternating pairs through another second select gate.

26. The memory device of claim 24, wherein the select gates are first select gates, the control line is a first control line, and further comprising:

an interposed bit-line pair between the alternate bit-line pairs so as to be adjacent to first and second bit-line pairs of the alternate bit-line pairs, the interposed bit-line pair having a first bit line at the first vertical level adjacent the second bit line of the first bit-line pair of the alternate bit-line pairs and a second bit line at the second vertical level adjacent the first bit line of the second bit-line pair of the alternate bit-line pairs; and a row of second select gates commonly coupled to a second control line;

wherein the first bit line of the interposed bit-line pair is selectively coupled to the same sensing circuit as the second bit line of the first bit-line pair of the alternate bit-line pairs through a second select gate and the second bit line of the interposed bit-line pair is selectively coupled to the same sensing circuit as the first bit line of the second bit-line pair of the alternating pairs through another second select gate.

27. A memory module, comprising:

a plurality of contacts; and two or more memory devices, each having access lines selectively coupled to the plurality of contacts;

wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to the first sensing device through a second select gate, the second bit line formed at a second level;

a third bit line adjacent the second bit line and selectively coupled to a second sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the fourth select gate; and wherein a control gate of the second select gate is coupled to a control gate of the third select gate.

28. A memory module, comprising:

a plurality of contacts; and two or more memory devices, each having access lines selectively coupled to the plurality of contacts;

wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to a second sensing device through a second select gate, the second bit line formed at a second level;

a third bit line adjacent the second bit line and selectively coupled to the first sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the second select gate; and wherein a control gate of the third select gate is coupled to a control gate of the fourth select gate.

29. A memory module, comprising:

a plurality of contacts; and two or more memory devices, each having access lines selectively coupled to the plurality of contacts;

wherein at least one of the memory devices comprises:

a row of select gates commonly coupled to a control line; and alternate bit-line pairs coupled to the select gates, each of the alternate bit-line pairs comprising a first bit line formed at a first vertical level and a second bit line formed at a second vertical level different than the first vertical level.

30. A memory module, comprising:

a housing having a plurality of contacts; and one or more memory devices enclosed in the housing and selectively coupled to the plurality of contacts;

wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to the first sensing device through a second select gate, the second bit line formed at a second level;

a third bit line adjacent the second bit line and selectively coupled to a second sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the fourth select gate; and wherein a control gate of the second select gate is coupled to a control gate of the third select gate.

31. A memory module, comprising:

a housing having a plurality of contacts; and one or more memory devices enclosed in the housing and selectively coupled to the plurality of contacts;

wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to a second sensing device through a second select gate, the second bit line formed at a second level;

a third bit line adjacent the second bit line and selectively coupled to the first sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the second select gate; and wherein a control gate of the third select gate is coupled to a control gate of the fourth select gate.

32. A memory module, comprising:

a housing having a plurality of contacts; and one or more memory devices enclosed in the housing and selectively coupled to the plurality of contacts;

wherein at least one of the memory devices comprises:

a row of select gates commonly coupled to a control line; and alternate bit-line pairs coupled to the select gates, each of the alternate bit-line pairs comprising a first bit line formed at a first vertical level and a second bit line formed at a second vertical level different than the first vertical level.

33. An electronic system, comprising:

a processor; and one or more memory devices coupled to the processor, wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to the first sensing device through a second select gate, the second bit line formed at a second level;

a third bit line adjacent the second bit line and selectively coupled to a second sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the fourth select gate; and wherein a control gate of the second select gate is coupled to a control gate of the third select gate.

34. An electronic system, comprising:

a processor; and one or more memory devices coupled to the processor, wherein at least one of the memory devices comprises:

an array of memory cells coupled to a plurality of bit lines;

a first bit line selectively coupled to a first sensing device through a first select gate, the first bit line formed at a first level;

a second bit line adjacent the first bit line and selectively coupled to a second sensing device through a second select gate, the second bit line formed at a second level;

a third bit line adjacent the second bit line and selectively coupled to the first sensing device through a third select gate, the third bit line formed at the first level;

a fourth bit line adjacent the third bit line and selectively coupled to the second sensing device through a fourth select gate, the fourth bit line formed at the second level;

wherein a control gate of the first select gate is coupled to a control gate of the second select gate; and wherein a control gate of the third select gate is coupled to a control gate of the fourth select gate.

35. An electronic system, comprising:

a processor; and one or more memory devices coupled to the processor, wherein at least one of the memory devices comprises:

a row of select gates commonly coupled to a control line; and alternate bit-line pairs coupled to the select gates, each of the alternate bit-line pairs comprising a first bit line formed at a first vertical level and a second bit line formed at a second vertical level different than the first vertical level.

* * * * *